US009966729B2

(12) United States Patent
Yabe

(10) Patent No.: US 9,966,729 B2
(45) Date of Patent: May 8, 2018

(54) LASER LIGHT SOURCE MODULE AND LASER LIGHT SOURCE DEVICE

(71) Applicant: Mitsubishi Electric Corporation, Tokyo (JP)

(72) Inventor: Mitoru Yabe, Tokyo (JP)

(73) Assignee: MITSUBISHI ELECTRIC CORPORATION, Tokyo (JP)

(\*) Notice: Subject to any disclaimer, the term of this patent is extended or adjusted under 35 U.S.C. 154(b) by 0 days. days.

(21) Appl. No.: 14/475,914

(22) Filed: Sep. 3, 2014

(65) Prior Publication Data

US 2015/0229106 A1    Aug. 13, 2015

(30) Foreign Application Priority Data

Feb. 13, 2014  (JP) .................... 2014-025005

(51) Int. Cl.
| | | |
|---|---|---|
| *H01S 5/022* | (2006.01) | |
| *H01S 5/40* | (2006.01) | |
| *H01S 5/024* | (2006.01) | |

(52) U.S. Cl.
CPC ...... *H01S 5/02252* (2013.01); *H01S 5/02248* (2013.01); *H01S 5/02256* (2013.01); *H01S 5/02268* (2013.01); *H01S 5/02288* (2013.01); *H01S 5/02469* (2013.01); *H01S 5/405* (2013.01); *H01S 5/4012* (2013.01); *H01S 5/4031* (2013.01); *H01S 5/4043* (2013.01); *H01S 5/02208* (2013.01); *H01S 5/02272* (2013.01); *H01S 5/02276* (2013.01); *H01S 5/02284* (2013.01); *H01S 5/02476* (2013.01)

(58) Field of Classification Search
CPC ...... H01S 5/4031; H01S 5/405; H01S 5/4043; H01S 5/022; H01S 5/02248; H01S 5/02256; H01S 5/02268
See application file for complete search history.

(56) References Cited

U.S. PATENT DOCUMENTS

| 5,065,226 A | 11/1991 | Kluitmans et al. |
|---|---|---|
| 6,410,904 B1 | 6/2002 | Ito et al. |

(Continued)

FOREIGN PATENT DOCUMENTS

| CN | 101071936 A | 11/2007 |
|---|---|---|
| CN | 102053319 A | 5/2011 |
| JP | 55-006338 A | 1/1980 |
| JP | 62-102581 A | 5/1987 |
| JP | 05-333246 A | 12/1993 |
| JP | 07-221470 A | 8/1995 |

(Continued)

*Primary Examiner* — Marcia Golub-Miller
(74) *Attorney, Agent, or Firm* — Birch, Stewart, Kolasch & Birch, LLP

(57) ABSTRACT

A laser light source module includes: a plate-shaped stem; a power supply lead pin having an upper end protruding from an upper surface being one of main surfaces of the stem and a lower end penetrating to extend toward a lower surface side, the lower surface being the other of the main surface of the stem; a block fixed to the upper surface of the stem; a submount substrate that is fixed to a surface of the block and includes the semiconductor laser array mounted thereon, the surface being parallel to the upper surface of the stem; the semiconductor laser array located on the submount substrate such that a light emitting direction is parallel to the upper surface of the stem; and a collimator lens array that is located on a front surface of the semiconductor laser array and converts an output light beam of the semiconductor laser array into a parallel light beam.

7 Claims, 5 Drawing Sheets

(56) References Cited

U.S. PATENT DOCUMENTS

| | | |
|---|---|---|
| 7,539,233 B2 | 5/2009 | Teramura et al. |
| 8,233,512 B2 | 7/2012 | Tamaya et al. |
| 8,562,286 B2 | 10/2013 | Gleiner et al. |
| 8,736,966 B2 | 5/2014 | Sasamuro et al. |
| 8,960,974 B2 | 2/2015 | Yabe et al. |
| 2002/0136250 A1 | 9/2002 | Roellig et al. |
| 2003/0048819 A1 | 3/2003 | Nagano et al. |
| 2004/0027631 A1* | 2/2004 | Nagano .............. G02B 6/4206 372/36 |
| 2004/0113276 A1 | 6/2004 | Henning et al. |
| 2006/0222042 A1 | 10/2006 | Teramura et al. |
| 2007/0115617 A1 | 5/2007 | Schulte et al. |
| 2007/0116073 A1* | 5/2007 | Schulte .............. H01S 5/02252 372/36 |
| 2008/0054076 A1 | 3/2008 | Schleuning et al. |
| 2010/0260226 A1 | 10/2010 | Tamaya et al. |
| 2011/0096542 A1 | 4/2011 | Yabe et al. |
| 2012/0243105 A1 | 9/2012 | Sasamuro et al. |

FOREIGN PATENT DOCUMENTS

| | | |
|---|---|---|
| JP | 2000-335009 A | 12/2000 |
| JP | 2001-228417 A | 8/2001 |
| JP | 2002-314182 A | 10/2002 |
| JP | 2003-158332 A | 5/2003 |
| JP | 2004-047651 A | 2/2004 |
| JP | 2005-317925 A | 11/2005 |
| JP | 2006-284851 A | 10/2006 |
| JP | 2007-142439 A | 6/2007 |
| JP | 2009-124119 A | 6/2009 |
| JP | 2010-135687 A | 6/2010 |
| JP | 2011-008090 A | 1/2011 |
| JP | 2011-243717 A | 12/2011 |
| JP | 2012-064609 A | 3/2012 |
| JP | 2012-199447 A | 10/2012 |
| JP | 2013-140837 A | 7/2013 |
| KP | 10-1142561 B1 | 5/2012 |
| WO | WO 2009/081470 A1 | 7/2009 |

* cited by examiner

LASER LIGHT SOURCE MODULE AND LASER LIGHT SOURCE DEVICE

BACKGROUND OF THE INVENTION

Field of the Invention

The present invention relates to a laser light source module and a laser light source device, and more particularly, it relates to the laser light source device that includes the plurality of laser light source modules mounted therein and condenses and emits a plurality of laser light beams.

Description of the Background Art

In recent years, a laser processing machine and a video display device such as a projector using semiconductor laser light beams as light source that have been widespread require the laser light source in a smaller size producing a higher output. Thus, a laser light source module including a semiconductor laser array mounted therein has been developed, the semiconductor laser array having semiconductor laser elements disposed in an array. Moreover, a laser light source device that includes the plurality of laser light source modules mounted therein and condenses and emits laser light beams from the plurality of laser light source modules has been developed (for example, see International Patent Publication No. WO 2009/081470 and Japanese Patent Application Laid-Open No. 2011-243717).

International Patent Publication No. WO 2009/081470 discloses a stem on which a plurality of power supply lead pins are provided vertically, a heat sink mounted on the stem, a submount substrate, and a laser light source module bonded to a semiconductor laser array in which a plurality of laser elements are disposed in an array through a lead frame. The laser light source module is configured to supply, with current, the lead pins extending from the bottom surface of the stem serving as a mounting surface and a cooling surface of the laser light source module to emit diverging light beams vertically to the bottom surface of the stem from the semiconductor laser array.

Japanese Patent Application Laid-Open No. 2011-243717 discloses a laser light source device in which a plurality of semiconductor laser arrays are disposed stepwise, laser light beams from each semiconductor laser array are collimated for both fast axis and slow axis, the fast axes alone are collectively condensed using a condensing lens, and the resulting light beams are optically combined into one by an optical fiber array composed of the same plurality of optical fibers arranged in the same pitch as the plural beams irradiated from the condensing lens.

However, in the technique of International Patent Publication No. WO 2009/081470, the diverging light beams are emitted vertically to the bottom surface of the stem serving as the mounting surface and the cooling surface of the laser light source module. Thus, in a case where the laser light source device (so-called spatial coupling laser light source device) that includes the plurality of laser light source modules mounted therein and condenses the laser light beams emitted from the laser light source modules is configured, it is difficult to reduce the gap between the laser light beam emitting portions even if the stems are disposed adjacent to each other. Therefore, a large-size condensing lens for condensing the laser light beams is needed, resulting in a problem that the laser light source device increases in size.

Furthermore, to collectively condense the laser light beams emitted from the plurality of laser light source modules, the collimator lens for accurately converting the diverging light beams emitted from each of the laser light source modules into parallel light beams is needed, and furthermore, each of the parallel light beams is needed to be parallel to each other with high accuracy, so that when each of the laser light source modules is disposed, the laser light source modules and the collimator lens require adjustments to be disposed, thereby resulting in complicated assembly and adjustments.

Moreover, in Japanese Patent Application Laid-Open No. 2011-243717, the same plurality of expensive optical fiber arrays in the same pitch as the plural beams are needed, and to condense the light beams to the optical fiber arrays, each of the semiconductor laser arrays and the collimator lens require highly accurate adjustments to the positions thereof to be fixed, thereby resulting in complicated assembly and adjustment operation. Furthermore, the semiconductor laser arrays fail to be disposed in the laser array arrangement direction, which prevents miniaturization and lower prices.

SUMMARY OF THE INVENTION

It is an object of the present invention to provide laser light source modules capable of being densely disposed. It is also another object of the present invention to provide a laser light source device including a plurality of laser light source modules densely mounted therein.

The laser light source module according to the present invention includes a plate-shaped stem and a power supply lead pin that serves as a power supply line for a semiconductor laser array, said power supply lead pin having an upper end protruding from an upper surface being one of main surfaces of the stem and a lower end penetrating to extend toward a lower surface side, the lower surface being the other of the main surface of the stem. The laser light source module further includes a block fixed to the upper surface of the stem and a submount substrate that is fixed to a surface of the block and includes the semiconductor laser array mounted thereon, the surface being parallel to the upper surface of the stem. The laser light source module further includes the semiconductor laser array located on the submount substrate such that a light emitting direction is parallel to the upper surface of the stem and a collimator lens array that is located on a front surface of the semiconductor laser array and converts an output light beam of the semiconductor laser array into a parallel light beam. The collimator lens array is fixed to the surface of the block, the surface being vertical to the upper surface of the stem.

In the laser light source module according to the present invention, the semiconductor laser array is disposed such that the light emitting direction is parallel to the upper surface of the stem. Thus, when the laser light source modules are disposed stepwise, the laser light source modules can be densely disposed in a vertical direction (height direction of steps). In other words, collimated light beams can be densely disposed in a horizontal direction and in a vertical direction.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
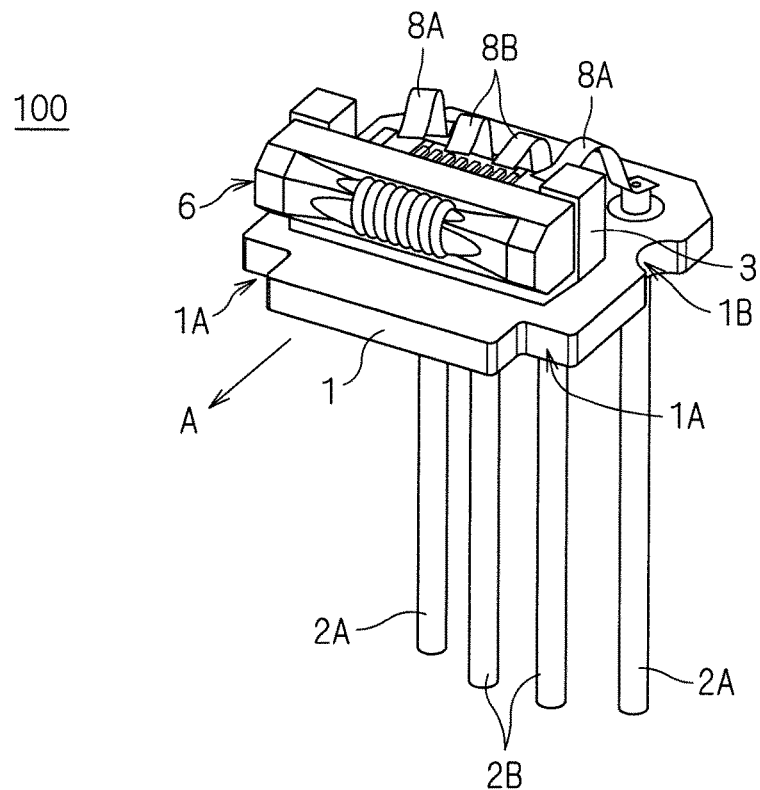
FIG. 1 is a perspective view of a laser light source module according to a first preferred embodiment.
Figure 2:
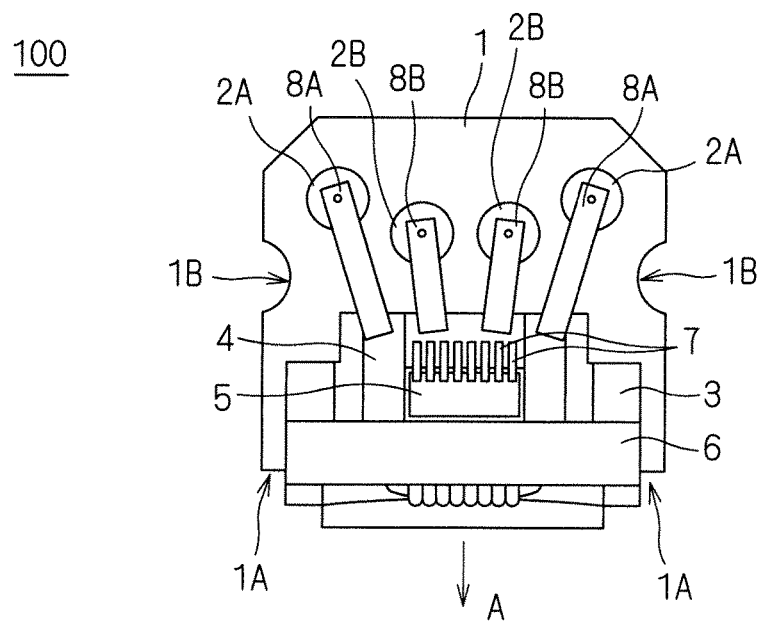
FIG. 2 is a top view of the laser light source module according to the first preferred embodiment.
Figure 3:
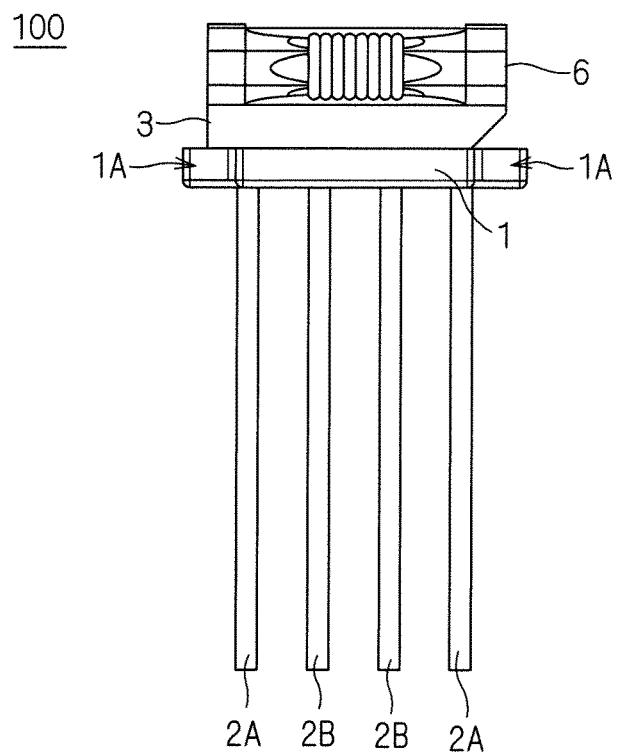
FIG. 3 is a front view of the laser light source module according to the first preferred embodiment.
Figure 4:
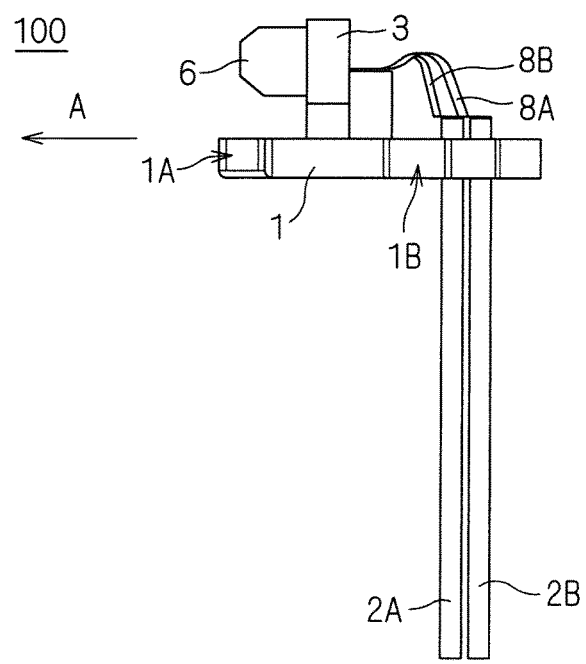
FIG. 4 is a side view of the laser light source module according to the first preferred embodiment.
Figure 5:
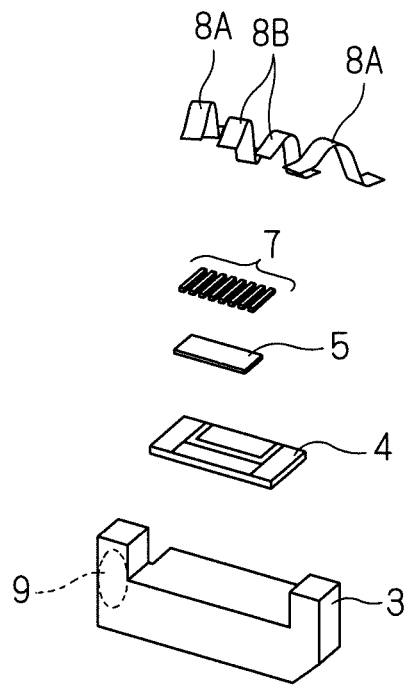
FIG. 5 is an exploded perspective view of the laser light source module according to the first preferred embodiment.
Figure 5:
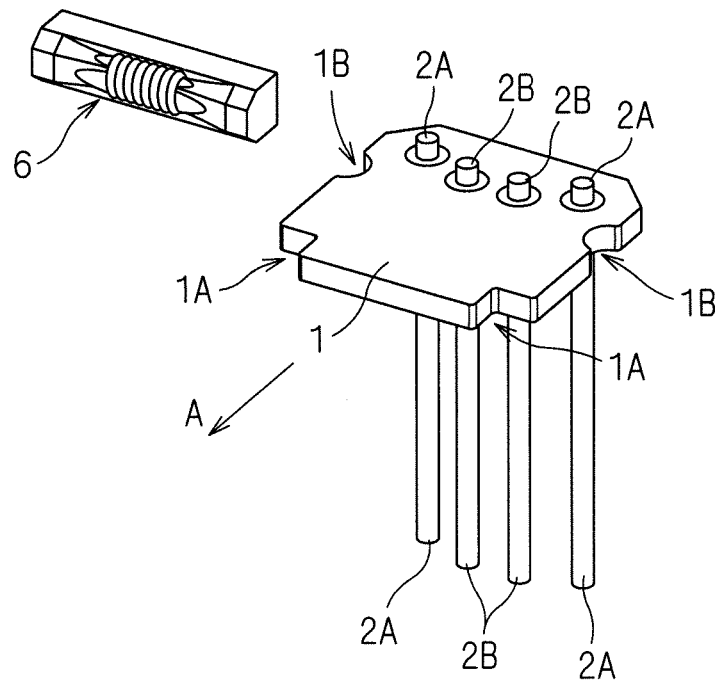

FIG. 1 is a perspective view of a laser light source module 100 in this preferred embodiment. FIGS. 2, 3, and 4 are a top view, a front view, and a side view of the laser light source module 100 in this preferred embodiment, respectively. FIG. 5 is an exploded perspective view of the laser light source module 100 in this preferred embodiment.

As shown in FIGS. 1 to 5, the laser light source module 100 includes a plate-shaped stem 1, a plurality of power supply lead pins 2A, 2B provided to the stem 1, and a block 3 fixed to an upper surface of the stem 1.

The stem 1 made of a metal material is in a plate shape. In other words, its shape has one main surface (namely, upper surface) and the other main surface (namely, lower surface) which are parallel to each other. In a plan view, the stem 1 is a rectangle with opposing sides in parallel to each other, except for notch portions such as positioning notches 1A and fixing notches 1B which will be described later.

The power supply lead pins 2A in a pair and the power supply lead pins 2B in a pair are fixed to the stem 1 by glass sealing. The power supply lead pins 2A and 2B penetrate through the main surface of the stem 1. In other words, the upper ends of the power supply lead pins 2A and 2B protrude from the upper surface of the stem 1, and the lower ends of the power supply lead pins 2A, 2B extend toward the lower surface of the stem 1. The power supply lead pins 2A, 2B supply a semiconductor laser array 5, which will be described later, with power.

The block 3 is made of a material having high heat conductivity. The block 3 is fixed to the upper surface of the stem 1 by soldering, for example.

The laser light source module 100 further includes a submount substrate 4 fixed to the upper surface of the block 3 and the semiconductor laser array 5 located on the submount substrate 4. The upper surface of the block 3 to which the submount substrate 4 is fixed is parallel to the upper surface of the stem 1. The semiconductor laser array 5 is disposed on the submount substrate 4 such that a light emitting direction is parallel to the upper surface of the stem 1. Here, the light emitting direction is a direction shown by an arrow A in FIGS. 1, 2, and 4. The array arrangement direction in the semiconductor laser array 5 is an arrangement direction of a plurality of laser elements included in the semiconductor laser array 5 and also a direction orthogonal to the light emitting direction.

The submount substrate 4 uses a material having excellent insulating properties for a base material, and electrode patterns are formed on a surface of the submount substrate 4. The semiconductor laser array 5 is mounted on the submount substrate 4 by soldering.

The stem 1 has the positioning notches 1A provided in a pair at both end portions of a side surface on a front direction side of the light emitting direction (arrow A direction) of the stem 1. The stem 1 has the fixing notches 1B provided in a pair on side surfaces on side direction sides of the light emitting direction (arrow A direction) of the stem 1. The fixing notches 1B have a semicircular shape in the plan view. The positioning notches 1A are used as the reference for positioning when the laser light source module 100 is disposed on a fixing base 10 which will be described in a second preferred embodiment. The fixing notches 1B are used for fixing the laser light source module 100 to the fixing base 10 (second preferred embodiment) with screws.

The laser light source module 100 further includes a collimator lens array 6 converting output light beams of the semiconductor laser array 5 into parallel light beams. The collimator lens array 6 is disposed on a front surface of the semiconductor laser array 5. The collimator lens array 6 is fixed to a surface of the block 3, the surface being vertical to the upper surface of the stem 1.

A cathode electrode pattern and an anode electrode pattern are formed on the surface of the submount substrate 4. An upper surface electrode and a bottom surface electrode are provided on the semiconductor laser array 5. For example, the bottom surface electrode of the semiconductor laser array 5 is connected to the cathode electrode pattern of the submount substrate 4. The upper surface electrode of the semiconductor laser array 5 is connected to the anode electrode pattern of the submount substrate 4. The upper surface electrode of the semiconductor laser array 5 is connected to the electrode pattern of the submount substrate 4 through a plurality of wires 7.

The electrode patterns of the submount substrate 4 are bonded to the upper end surfaces of the power supply lead pins 2A, 2B by ultrasonic bonding with power supply ribbons 8A, 8B.

In the laser semiconductor module 100 with the above-mentioned configuration, if a predetermined current is passed between the power supply lead pins 2A in a pair and the power supply lead pins 2B in a pair, the semiconductor laser array 5 emits light beams. The parallel light beams corresponding to the number of emitters of the semiconductor laser array 5 are emitted from the collimator lens array 6 in a direction parallel to the upper surface of the stem 1.

The collimator lens array 6 has a shape elongated in the array arrangement direction of the semiconductor laser array 5. The collimator lens array 6 is fixed to the block 3 at one end in a longitudinal direction (region 9 in FIG. 5) with UV-curable adhesive. The collimator lens array 6 is fixed at the one spot, which can prevent a crack, deformation, and displacement of the collimator lens array 6 caused by a difference in linear expansion coefficient between the collimator lens array 6 and the block 3. In other words, the laser light source module 100 having high reliability can be provided.

Upon fixing of the collimator lens array 6 to the block 3, the fixed position of the collimator lens array 6 is adjusted such that collimated light beams are emitted at an appropriate angle with the semiconductor laser array 5 emitting the light beams.

The block 3 made of pure copper is manufactured by wire-cut electric discharge machining. The surface of the block 3 is applied with nickel plating and gold plating. A uniform discharge trace is formed on the surface of the block 3 by the wire-cut electric discharge machining.

The uniform discharge trace is formed on the surface of the block 3, whereby a solder layer is formed uniformly upon bonding of the submount substrate 4 to the block 3 by soldering. The solder layer is formed uniformly, so that warpage and stress of the block 3 hardly affect the semiconductor laser array 5 located on the submount substrate 4. This allows the thin laser light source module 100 having high reliability to be provided without wavelength variation and degradation inside the semiconductor laser array 5 even if the block 3 is reduced in thickness.

<Effects>

The laser light source module 100 according to this preferred embodiment includes: the plate-shaped stem 1; power supply lead pins 2A, 2B serving as power supply lines for the semiconductor laser array 5, the power supply lead pins 2A, 2B having the upper ends protruding from the upper surface being one of the main surfaces of the stem 1 and the lower ends penetrating to extend toward the lower surface side, the lower surface being the other of the main surface of the stem 1; the block 3 fixed to the upper surface of the stem 1; the submount substrate 4 that is fixed to the surface of the block 3 and includes the semiconductor laser array 5 mounted thereon, the surface being parallel to the upper surface of the stem 1; the semiconductor laser array 5 located on the submount substrate 4 such that the light emitting direction is parallel to the upper surface of the stem 1; and the collimator lens array 6 that is located on the front surface of the semiconductor laser array 5 and converts the output light beams of the semiconductor laser array 5 into the parallel light beams. The collimator lens array 6 is fixed to the surface of the block 3, the surface being vertical to the upper surface of the stem 1.

Therefore, in the laser light source module 100, the semiconductor laser array 5 is disposed such that the light emitting direction is parallel to the upper surface of the stem 1. Thus, in a case where the laser light source modules 100 are disposed stepwise, the laser light source modules 100 can be densely disposed in a vertical direction (height direction of steps). In other words, the collimated light beams can be densely disposed in a horizontal direction and in a vertical direction.

Moreover, the laser light source module 100 of this preferred embodiment is characterized in that the side surfaces of the stem 1 have the positioning notches 1A and the fixing notches 1B.

Therefore, the positioning protrusions as the reference for a mounting position of the laser light source module 100 are provided on the fixing base fixing the laser light source module 100, and the positioning protrusions fit to the positioning notches 1A of the laser light source module 100. This enables the laser light source module 100 to be easily located with high accuracy without requiring excess space for positioning in the stem 1.

Screw holes overlapping the fixing notches 1B in the plan view are provided in the fixing base fixing the laser light source module 100, and the fixing notches 1B are fastened with the screw holes using screws. This enables the laser light source module 100 to be screwed to the fixing base without requiring excess space for fixing the laser light source module 100 to the stem 1.

When the laser light source module 100 is disposed on the fixing base, the positioning protrusions located on the fixing base fit to the positioning notches 1A, to thereby define the position to locate the laser light source module 100 on the fixing base.

Therefore, the positioning protrusions as the reference for the mounting position of the laser light source module 100 are provided on the fixing base fixing the laser light source module 100 and the positioning protrusions fit to the positioning notches 1A of the laser light source module 100, whereby the position to locate the laser light source module 100 can be easily defined with high accuracy.

The laser light source module 100 of this preferred embodiment is characterized as follows. The positioning notches 1A are provided in a pair at both end portions of the side surface of the stem 1 on the front direction side of the light emitting direction. The fixing notches 1B are provided in a pair on the side surfaces of the stem 1 on the side direction sides of the light emitting direction. The fixing notches 1B have the semicircular shape in the plan view.

Therefore, the positioning protrusions as the reference for the mounting position of the laser light source module 100 are provided in a pair on the fixing base fixing the laser light source module 100, and the pair of positioning protrusions fit to the positioning notches 1A of the laser light source module 100. This enables the laser light source module 100 to be easily located with high accuracy without requiring excess space for positioning in the stem 1.

The fixing base fixing the laser light source module 100 is provided with the screw holes in a pair overlapping the fixing notches 1B in a pair in the plan view, and the pair of fixing notches 1B are fastened with the pair of screw holes using the screws. This enables the laser light source module 100 to be screwed to the fixing base more reliably without requiring excess space for fixing the laser light source module 100 to the stem 1. Furthermore, when the laser light source modules 100 are disposed adjacent to each other in the array arrangement direction of the semiconductor laser array 5, the adjacent laser light source modules 100 can share one screw hole between the fixing notches 1B. Thus, when the laser light source modules 100 are disposed adjacent to each other, the gap therebetween can be reduced and the laser light source modules 100 can be densely disposed side by side in a horizontal direction (array arrangement direction of the semiconductor laser array 5). In other words, the collimated light beams can be densely disposed in the horizontal direction.

The fixing notches 1B have the semicircular shape in the plan view, so that when the fixing notches 1B are screwed, the gap between the fixing notches 1B and the screws in the plan view is reduced, which can prevent displacement of the fixed positions of the laser light source modules 100.

The laser light source module 100 of this preferred embodiment is characterized as follows. The submount substrate 4 has the electrode patterns formed thereon. The upper ends of the power supply lead pins 2A, 2B are electrically connected to the electrode patterns through the power supply ribbons 8A, 8B.

Therefore, the laser light source module 100 capable of supplying the semiconductor laser array 5 with power can be provided in the simplified structure.

The laser light source module 100 of this preferred embodiment is characterized in that the block 3 is manufactured by the wire-cut electric discharge machining.

Therefore, the uniform discharge trace is formed on the surface of the block 3, whereby the solder layer is formed uniformly upon bonding of the submount substrate 4 to the block 3 by soldering. The solder layer is formed uniformly, so that warpage and stress of the block 3 hardly affect the semiconductor laser array 5 located on the submount substrate 4. This allows the thin laser light source module 100 having high reliability to be provided without wavelength variation and degradation inside the semiconductor laser array 5 even if the block 3 is reduced in thickness.

The laser light source module 100 of this preferred embodiment is characterized as follows. The collimator lens array 6 has the shape elongated in the array arrangement direction of the semiconductor laser array 5. The collimator lens array 6 is fixed to the block 3 at the single one spot of the end portion in the longitudinal direction with the adhesive.

Therefore, the collimator lens array 6 is fixed to the block 3 at the one spot, which can prevent a crack, deformation, and displacement of the collimator lens array 6 caused by the difference in linear expansion coefficient between the collimator lens array 6 and the block 3. In other words, the laser light source module 100 having high reliability can be provided.

Second Preferred Embodiment

This preferred embodiment will describe a spatial coupling laser light source device that includes the plurality of laser light source modules 100 mounted therein and condenses collimated light beams emitted from each laser light source module 100 to one point, the laser light source modules 100 being described in the first preferred embodiment.

Figure 6:
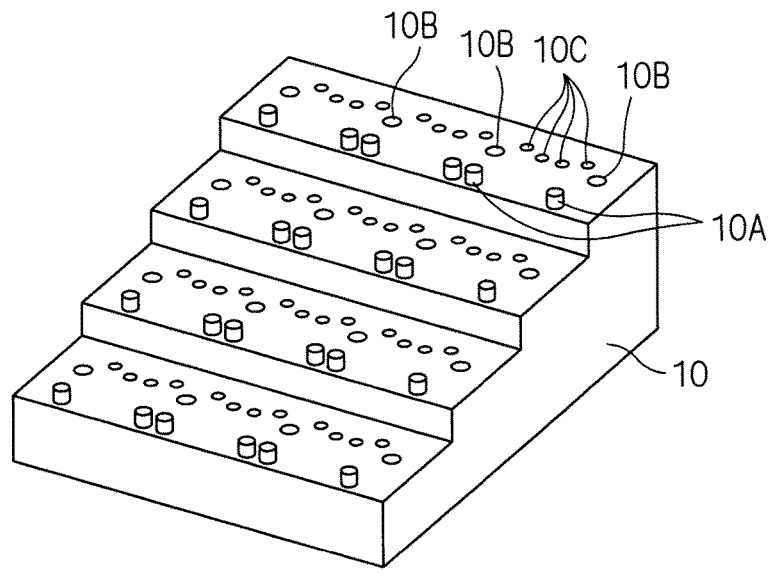
FIG. 6 is a perspective view of a fixing base of a laser light source device according to a second preferred embodiment.
Figure 7:
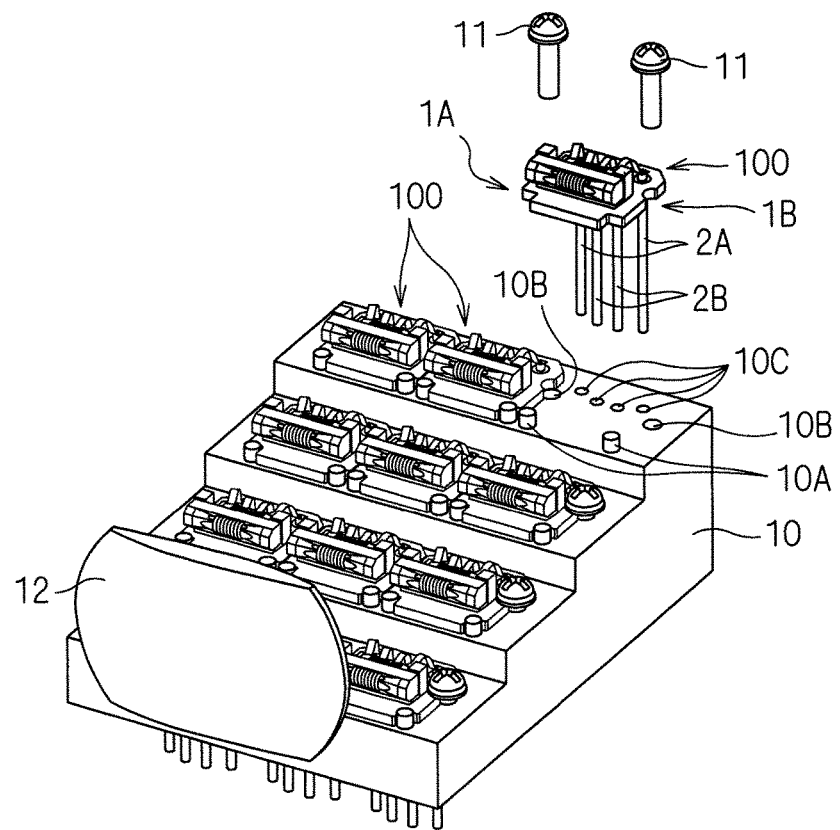
FIG. 7 is a perspective view of the laser light source device according to the second preferred embodiment.
Figure 8:
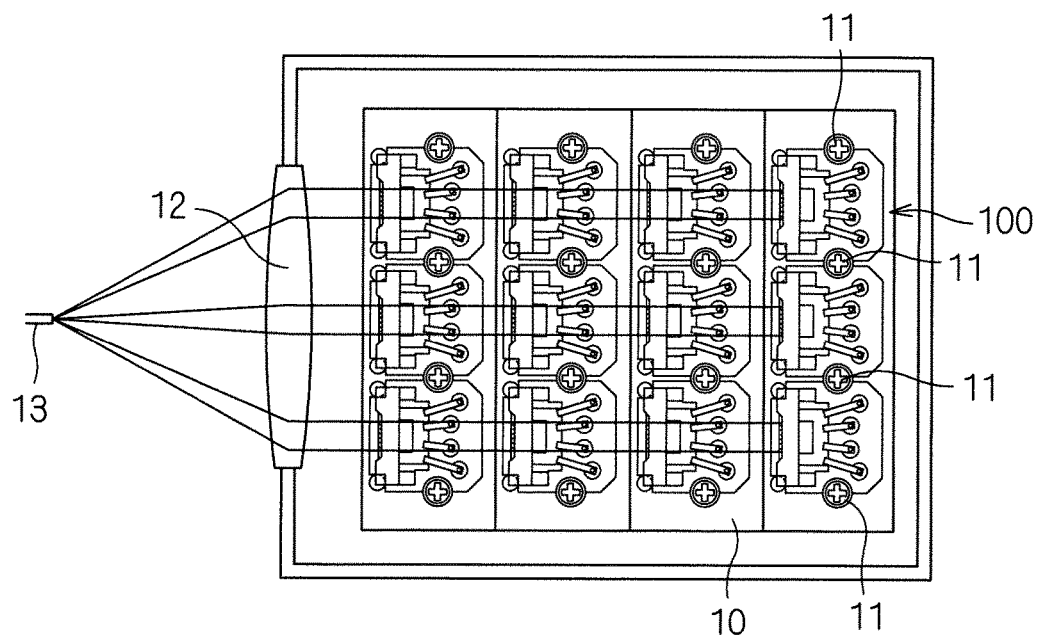
FIG. 8 is a top view of the laser light source device according to the second preferred embodiment.
Figure 9:
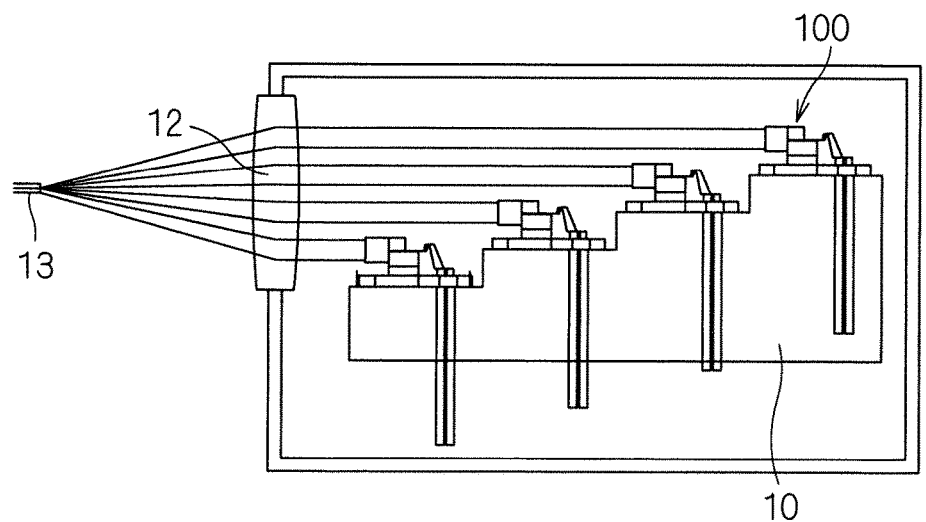
FIG. 9 is a side view of the laser light source device according to the second preferred embodiment.

FIG. 6 is a perspective view of the fixing base 10 of the laser light source device of this preferred embodiment. FIGS. 7, 8, and 9 are a perspective view, a top view, and a side view of the laser light source device of this preferred embodiment, respectively.

As shown in FIG. 6, the fixing base 10 has a plurality of steps in parallel to each other. As shown in FIGS. 7, 8, and 9, on each step of the fixing base 10, the plurality of laser light source modules 100 are disposed side by side in the array arrangement direction of the semiconductor laser array 5. The laser light source device of this preferred embodiment further includes a condensing lens 12. The condensing lens 12 condenses the collimated light beams emitted from each laser light source module 100 to one point and has them enter a light guide portion 13 (for example, a light fiber and a rod fiber).

As shown in FIG. 6, the fixing base 10 has a pair of positioning protrusions 10A, a pair of screw holes 10B, and a plurality of lead pin through holes 10C corresponding to each of the laser light source modules 100.

As shown in FIG. 7, the power supply lead pins 2A, 2B of the laser light source module 100 are inserted into the lead pin through holes 10C. The power supply lead pins 2A in a pair are electrically connected inside the lead pin through holes 10C. Similarly, the power supply lead pins 2B in a pair are electrically connected inside the lead pin through holes 10C.

In a state where the pair of positioning notches 1A of the laser light source module 100 is pressed against the pair of positioning protrusions 10A, the fixing notches 1B of the laser light source module 100 overlap the screw holes 10B in the plan view. In the above-mentioned state, the screw holes 10B are fastened with screws 11 from above the fixing notches 1B of the laser light source module 100 to fix the laser light source module 100 to the fixing base 10.

When the laser light source module 100 is disposed on the fixing base 10, the pair of positioning notches 1A as the reference for fixing the laser light source module 100 are pressed against the pair of positioning protrusions 10A, whereby the laser light source module 100 can be easily positioned with high accuracy. The pair of fixing notches 1B of the laser light source module 100 are fastened with the pair of screw holes 10B using the screws 11, and thus the laser light source module 100 can be reliably fixed to the fixing base 10.

The two laser light source modules 100 located adjacent to each other share the screw hole 10B on the adjacent side. That is, if the two laser light source modules 100 are disposed adjacent to each other, the two semicircular fixing notches 1B facing each other make a circular shape. In other words, this circular notch is fastened with one screw hole 10B using one screw 11, so that the fixing notches 1B of the two laser light source modules 100 located on both the sides of the circular notch can be fixed simultaneously.

The stem 1 of the laser light source module 100 has the pair of positioning notches 1A and the fixing base 10 has the pair of positioning protrusions 10A fitting to the pair of positioning notches 1A, so that excess space for positioning the laser light source module 100 is not required. Moreover, the stem 1 of the laser light source module 100 has the pair of fixing notches 1B and the fixing base 10 has the pair of screw holes 10B, so that excess space for fixing the laser light source module 100 is not required. Thus, the plurality of laser light source modules 100 can be densely disposed side by side in the array arrangement direction (horizontal direction) of the semiconductor laser array 5. In other words, the collimated light beams emitted from each laser light source module 100 can be densely disposed in the horizontal direction.

In the laser light source module 100, the semiconductor laser array 5 is disposed such that the light emitting direction is parallel to the upper surface of the stem 1. Thus, in a case where the light source modules 100 are disposed stepwise, the height of the laser light source module 100 can be suppressed. In other words, the laser light source modules 100 can be densely disposed in the vertical direction (height direction of steps). In other words, the collimated light beams can be densely disposed also in the vertical direction.

Each of the laser light source modules 100 is positioned with high accuracy using the pair of positioning notches 1A and the pair of positioning protrusions 10A, so that the collimated light beams emitted from each of the laser light source modules 100 are also parallel with high accuracy. Thus, the light beams can be condensed to one point through the condensing lens 12. The condensed laser light beams are incident on the light guide portion 13.

<Effects>

The laser light source device according to this preferred embodiment includes the fixing base 100 and the plurality of laser light source modules 100 fixed on the fixing base 10. The plurality of laser light source modules 100 are linearly located side by side in the array arrangement direction of the semiconductor laser array 5. The fixing base 10 includes, for each of said laser light source modules: the lead pin through holes 10A into which the power supply lead pins 2A, 2B are inserted; the pair of positioning protrusions 10A that fit to the positioning notches 1A provided in a pair; and the pair of screw holes 10B that overlap the fixing notches 1B provided in a pair in a plan view in a state where the pair of positioning protrusions 10A fit to the positioning notches 1A provided in a pair. In a state where the pair of positioning protrusions 10A fit to the positioning notches 1A provided in a pair, the screw holes 10B are fastened with the screws 11 from above the fixing notches 1B to fix the laser light source module 100 to the fixing base 10, and the laser light source modules 100 located adjacent to each other share the screw hole 10B on the adjacent side.

Therefore, the pair of positioning protrusions 10A provided on the fixing base 10 fit to the positioning notches 1A provided in a pair in the laser light source module 100, and thus the laser light source module 100 can be located with high accuracy on the fixing base 10.

The fixing base 10 has the pair of screw holes 10B fastened with the screws 11 from above the pair of fixing notches 1B. This enables the laser light source module 100 to be reliably screwed to the fixing base 10 without requiring excess space for fixing. Furthermore, when the laser light source modules 100 are disposed side by side in the array arrangement direction of the semiconductor laser array 5, the adjacent laser light source modules 100 can share one screw hole 10B between the fixing notches 1B. Thus, when the laser light source modules 100 are disposed adjacent to each other, the gap therebetween can be reduced and the laser light source modules 100 can be densely disposed side by side in the horizontal direction (array arrangement direction of the semiconductor laser array 5). In other words, the collimated light beams can be densely disposed in the horizontal direction.

In the laser light source device of this preferred embodiment, the fixing base 10 has the plurality of steps in parallel to each other, and on each step of the fixing base 10, the plurality of laser light source modules 100 are linearly located side by side in the array arrangement direction of the semiconductor laser array 5. The laser light source device of this preferred embodiment further includes the condensing lens 12 condensing light beams emitted from the laser light source module 100 to one point.

In the laser light source module 100, the semiconductor laser array 5 is disposed such that the light emitting direction is parallel to the upper surface of the stem 1. Thus, if the light source modules 100 are disposed stepwise, the laser light source modules 100 can be densely disposed in the vertical direction (height direction of steps). In other words, the collimated light beams can be densely disposed also in the vertical direction. In other words, the laser light source device of this preferred embodiment can densely dispose the collimated light beams in both of the horizontal direction and the vertical direction. Thus, the collimated light beams can be densely disposed, so that the diameter of the condensing lens 12 can be reduced. Therefore, cost of the condensing lens 12 can be suppressed. Moreover, the laser light source device can be reduced in size.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A laser light source module, comprising:
a plate-shaped stem;
a power supply lead pin that serves as a power supply line for a semiconductor laser array, said power supply lead pin having an upper end protruding from an upper surface being one of main surfaces of said stem and a lower end penetrating to extend toward a lower surface side, the lower surface being the other of the main surface of said stem;
a block fixed to the upper surface of said stem;
a submount substrate that is fixed to a surface of said block and includes said semiconductor laser array mounted thereon, the surface being parallel to the upper surface of said stem;
said semiconductor laser array located on said submount substrate such that a light emitting direction is parallel to the upper surface of said stem; and
a collimator lens array that is located on a front surface of said semiconductor laser array and converts an output light beam of said semiconductor laser array into a parallel light beam,
wherein said collimator lens array is fixed to a surface of said block, the surface being vertical to the upper surface of said stem,
side surfaces of said stem have positioning notches and fixing notches,
said positioning notches are provided in a pair at both end portions of a side surface of said stem on a front direction side of said light emitting direction,
said fixing notches are provided in a pair on side surfaces of said stem on side direction sides of said light emitting direction, and
said fixing notches have a semicircular shape in a plan view such that if two laser light source modules are positioned adjacent to each other in an array arrangement, the adjacent fixing notches form a circle.

2. The laser light source module according to claim 1, wherein when said laser light source module is disposed on a fixing base, said positioning notches are fitted to positioning protrusions located on said fixing base to define a position of said laser light source module to be disposed on said fixing base.

3. The laser light source module according to claim 1, wherein
said submount substrate has an electrode pattern formed thereon, and
the upper end of said power supply lead pin is electrically connected to said electrode pattern through a power supply ribbon.

4. The laser light source module according to claim 1, wherein said block is manufactured by wire-cut electric discharge machining.

5. The laser light source module according to claim 1, wherein
said collimator lens array has a shape elongated in an array arrangement direction of said semiconductor laser array, and
said collimator lens array is fixed to said block at a single one spot of an end portion in a longitudinal direction with an adhesive.

6. A laser light source device, comprising:
a fixing base; and
a plurality of the laser light source modules, fixed on said fixing base, wherein
each laser light source module includes
a plate-shaped stem;
a power supply lead pin that serves as a power supply line for a semiconductor laser array, said power supply lead pin having an upper end protruding from an upper surface being one of main surfaces of said stem and a lower end penetrating to extend toward a lower surface side, the lower surface being the other of the main surface of said stem;
a block fixed to the upper surface of said stem;
a submount substrate that is fixed to a surface of said block and includes said semiconductor laser array mounted thereon, the surface being parallel to the upper surface of said stem;
said semiconductor laser array located on said submount substrate such that a light emitting direction is parallel to the upper surface of said stem; and a collimator lens array that is located on a front surface of said semiconductor laser array and converts an output light beam of said semiconductor laser array into a parallel light beam, wherein said collimator lens array is fixed to a surface of said block, the surface being vertical to the upper surface of said stem, side surfaces of said stem have positioning notches and fixing notches, said positioning notches are provided in a pair at both end portions of a side surface of said stem on a front direction side of said light emitting direction, said fixing notches are provided in a pair on side surfaces of said stem on side direction sides of said light emitting direction, and said fixing notches have a semicircular shape in a plan view such that when two laser light source modules are positioned adjacent to each other in an array arrangement, the adjacent fixing notches form a circle, said plurality of laser light source modules are linearly located side by side in an array arrangement direction of said semiconductor laser array, said fixing base includes, for each of said laser light source modules:

a lead pin through hole into which said power supply lead pin is inserted;

a pair of positioning protrusions that fit to said positioning notches provided in a pair; and a pair of screw holes that overlap said fixing notches provided in a pair in a plan view in a state where said pair of positioning protrusions fit to said positioning notches provided in a pair, in a state where said pair of positioning protrusions fit to said positioning notches provided in a pair, said screw holes are fastened with screws from above said fixing notches to fix said laser light source module to said fixing base, and said laser light source modules located adjacent to each other share said screw hole on the adjacent side.

7. The laser light source device according to claim 6, wherein said fixing base has a plurality of steps, said plurality of steps are parallel to one another, on each of said plurality of steps, said plurality of laser light source modules are linearly located side by side in the array arrangement direction of said semiconductor laser array, and said laser light source device further comprises a condensing lens that condenses light beams emitted from said laser light source modules to one point.

* * * * *